(12) United States Patent
Takahashi et al.

(10) Patent No.: US 10,109,483 B2
(45) Date of Patent: Oct. 23, 2018

(54) VAPOR PHASE GROWTH APPARATUS, STORAGE CONTAINER, AND VAPOR PHASE GROWTH METHOD

(71) Applicant: NuFlare Technology, Inc., Kanagawa (JP)

(72) Inventors: Hideshi Takahashi, Kanagawa (JP); Yuusuke Sato, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 100 days.

(21) Appl. No.: 14/930,975

(22) Filed: Nov. 3, 2015

(65) Prior Publication Data
US 2016/0133457 A1 May 12, 2016

(30) Foreign Application Priority Data
Nov. 7, 2014 (JP) .................................. 2014-227547

(51) Int. Cl.
*H01L 21/02* (2006.01)
*C30B 25/10* (2006.01)
(Continued)

(52) U.S. Cl.
CPC .......... *H01L 21/0262* (2013.01); *C30B 25/10* (2013.01); *C30B 25/14* (2013.01);
(Continued)

(58) Field of Classification Search
None
See application file for complete search history.

(56) References Cited

U.S. PATENT DOCUMENTS 4,911,101 A * 3/1990 Ballingall, III ..... C23C 16/4482
118/708
5,381,605 A 1/1995 Krafft
(Continued)

FOREIGN PATENT DOCUMENTS

JP 04-114728 4/1992
JP 07-312344 11/1995
(Continued)

OTHER PUBLICATIONS

German Office Action dated Mar. 5, 2018 issued in the corresponding German patent application No. 10 2015 221 830.9 and its English translation.
(Continued)

*Primary Examiner* — Erin F Bergner
(74) *Attorney, Agent, or Firm* — Rankin, Hill & Clark LLP

(57) ABSTRACT

A vapor phase growth apparatus according to one embodiment includes a reaction chamber, a storage container storing organic metal, a thermostatic bath storing a liquid with a temperature higher than a room temperature and holding the storage container immersed in the liquid, a carrier gas supply path connected to the storage container and supplying a carrier gas to the storage container, an organic-metal-containing gas transportation path connected to the storage container and the reaction chamber, the organic-metal-containing gas transportation path transporting an organic-metal-containing gas to the reaction chamber, the organic-metal-containing gas including the organic metal generated by bubbling or sublimation with the carrier gas, and a diluent gas transportation path connected to the organic-metal-containing gas transportation path at a position below a liquid level of the liquid in the thermostatic bath and
(Continued)

transporting a diluent gas for diluting the organic-metal-containing gas.

13 Claims, 3 Drawing Sheets

(51) Int. Cl.
 *C30B 25/14* (2006.01)
 *C30B 29/40* (2006.01)
(52) U.S. Cl.
 CPC ........ *C30B 29/406* (2013.01); *H01L 21/0254* (2013.01); *H01L 21/02579* (2013.01)

(56) References Cited

U.S. PATENT DOCUMENTS

| | | | |
|---|---|---|---|
| 2003/0054099 A1* | 3/2003 | Jurgensen | ........... C23C 14/0015 427/248.1 |
| 2005/0066893 A1 | 3/2005 | Soininen | |
| 2007/0254100 A1 | 11/2007 | Nijhawan | |
| 2008/0099933 A1* | 5/2008 | Choi | ................... C23C 16/4481 261/52 |
| 2014/0216339 A1 | 8/2014 | Nagase | |

FOREIGN PATENT DOCUMENTS

| | | |
|---|---|---|
| JP | 09-148257 | 6/1997 |
| JP | 2002-289531 | 10/2002 |
| JP | 2006-117961 | 5/2006 |

OTHER PUBLICATIONS

Japanese Office Action (JPOA) dated Jul. 3, 2018 issued in the corresponding Japanese patent application No. 2014-227547 and its English translation.

* cited by examiner

VAPOR PHASE GROWTH APPARATUS, STORAGE CONTAINER, AND VAPOR PHASE GROWTH METHOD

CROSS-REFERENCE TO RELATED APPLICATION

This application is based upon and claims the benefit of priority from Japanese Patent Applications No. 2014-227547, filed on Nov. 7, 2014, the entire contents of which are incorporated herein by reference.

FIELD OF THE INVENTION

The present invention relates to a vapor phase growth apparatus, a storage container, and a vapor phase growth method.

BACKGROUND OF THE INVENTION

As a method for forming a high-quality semiconductor film, there is an epitaxial growth technique which grows a single-crystal film on a substrate, such as a wafer, using vapor phase growth. In a vapor phase growth apparatus using the epitaxial growth technique, a wafer is placed on a support portion in a reaction chamber which is maintained at atmospheric pressure or reduced pressure. Then, a process gas, such as a source gas which will be a raw material for forming a film, is supplied from, for example, a shower plate that is provided at an upper part of the reaction chamber to the surface of the wafer while the wafer is being heated. The thermal reaction of the source gas occurs in the surface of the wafer and an epitaxial single-crystal film is formed on the surface of the wafer.

In recent years, a gallium nitride (GaN)-based semiconductor device has drawn attention as a material of a light emitting device or a power device. There is a metal organic chemical vapor deposition method (MOCVD method) as an epitaxial growth technique for forming a GaN-based semiconductor film. In the metal organic chemical vapor deposition method, organic metal, such as trimethylgallium (TMG) trimethylindium (TMI), or trimethylaluminum (TMA), or ammonia ($NH_3$) is used as the source gas.

The MOCVD method bubbles or sublimates liquid or solid organic metal stored in a storage tank with gas such as hydrogen, to generate a source gas including organic metal and supplies the source gas to a reaction chamber. However, since the saturated vapor pressure of organic metal is relatively low, it is difficult to stably supply an organic-metal-containing gas. JP H4-114728 discloses a technique which prevents the condensation of a source gas in a pipe.

SUMMARY OF THE INVENTION

A vapor phase growth apparatus according to an aspect of the invention includes a reaction chamber, a storage container storing organic metal, a thermostatic bath storing a liquid with a temperature higher than a room temperature and holding the storage container immersed in the liquid, a carrier gas supply path connected to the storage container and supplying a carrier gas to the storage container, an organic-metal-containing gas transportation path connected to the storage container and the reaction chamber, the organic-metal-containing gas transportation path transporting an organic-metal-containing gas to the reaction chamber, the organic-metal-containing gas including the organic metal generated by bubbling or sublimation with the carrier gas, and a diluent gas transportation path connected to the organic-metal-containing gas transportation path at a position below a liquid level of the liquid in the thermostatic bath and transporting a diluent gas for diluting the organic-metal-containing gas.

A vapor phase growth method according to another aspect of the invention includes loading a substrate to a reaction chamber, bubbling or sublimating organic metal stored in a storage container with a carrier gas to generate an organic-metal-containing gas, the storage container being immersed in a liquid with a predetermined temperature higher than a room temperature, diluting the organic-metal-containing gas with a diluent gas at a position below a liquid level of the liquid, and supplying the diluted organic-metal-containing gas to the reaction chamber to form a semiconductor film on a surface of the substrate.

DETAILED DESCRIPTION OF THE EMBODIMENTS

Figure 1:
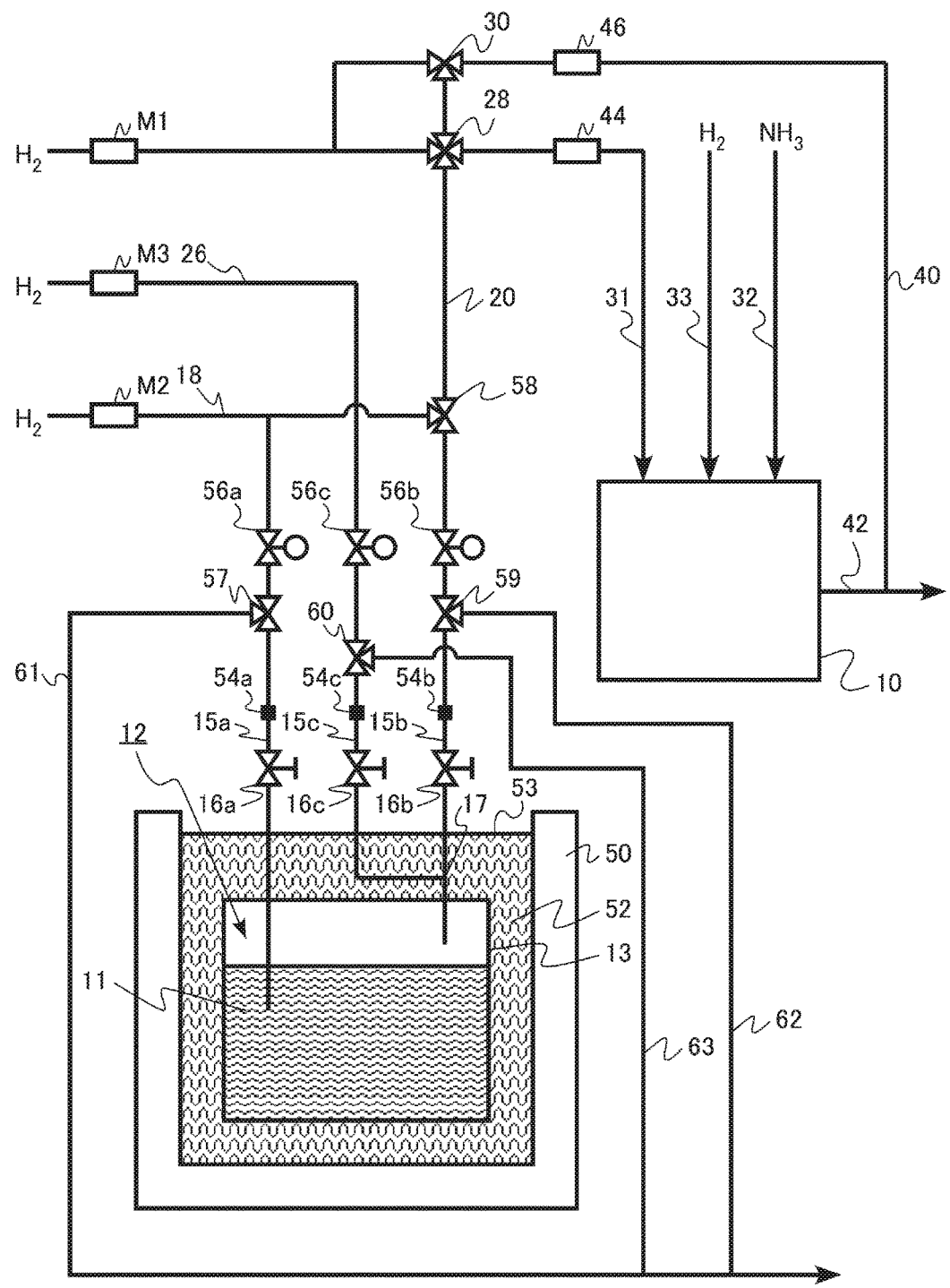
FIG. 1 is a diagram illustrating the structure of a vapor phase growth apparatus according to an embodiment.

Hereinafter, embodiments of the invention will be described with reference to the drawings.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference. Furthermore, a "longitudinal direction" is the direction of gravity.

In the specification, a "process gas" is a general term of gas which is used to form a film on a substrate. The concept of the "process gas" includes, for example, a source gas, carrier gas, a diluent gas, a separation gas, a compensation gas, and a bubbling gas.

In the specification, the "compensation gas" means a process gas which does not include a source gas and is supplied to a reaction chamber through the same supply path as the source gas before the source gas is supplied to the reaction chamber. Immediately before a film is formed, gas switches from the compensation gas to the source gas to reliably prevent a change in environment, such as a change in the internal pressure of the reaction chamber or a temperature change and to stabilize the formation of a film on a substrate.

In the specification, the "separation gas" is a process gas which is introduced into the reaction chamber of the vapor phase growth apparatus and is a general term of gas which separates the process gases which are a plurality of raw material gases.

A vapor phase growth apparatus according to embodiment includes a reaction chamber, a storage container that stores organic metal, a thermostatic bath that stores a liquid with a temperature higher than a room temperature and holds the storage container immersed in the liquid, a carrier gas supply path that is connected to the storage container and supplies a carrier gas to the storage container, an organic-metal-containing gas transportation path connected to the storage container and the reaction chamber, the organic-metal-containing gas transportation path transporting an organic-metal-containing gas to the reaction chamber, the organic-metal-containing gas including the organic metal generated by bubbling or sublimation with the carrier gas, and a diluent gas transportation path that is connected to the organic-metal-containing gas transportation path at a position below a liquid level of the liquid in the thermostatic bath and transports a diluent gas for diluting the organic-metal-containing gas.

A vapor phase growth method according to this embodiment includes loading a substrate to a reaction chamber, bubbling or sublimating organic metal stored in a storage container with a carrier gas to generate an organic-metal-containing gas, the storage container being immersed in a liquid with a predetermined temperature higher than a room temperature, diluting the organic-metal-containing gas with a diluent gas at a position below a liquid level of the liquid, and supplying the diluted organic-metal-containing gas to the reaction chamber to form a semiconductor film on a surface of the substrate.

FIG. 1 is a diagram illustrating a vapor phase growth apparatus according to this embodiment. The vapor phase growth apparatus according to this embodiment is a vertical single-wafer-type epitaxial growth apparatus that uses a metal organic chemical vapor deposition (MOCVD) method. Hereinafter, an example in which uncoped gallium nitride (GaN) is epitaxially grown will be mainly described.

The vapor phase growth apparatus includes a reaction chamber 10 in which a film is formed on a substrate such as a wafer. The vapor phase growth apparatus further includes a first gas supply path 31, a second gas supply path 32, and a third gas supply path 33 which supply the process gas to the reaction chamber 10.

A main carrier gas is supplied to the first gas supply path 31. The first gas supply path 31 includes a mass flow controller M1 that controls the flow rate of the main carrier gas.

The first gas supply path 31 supplies a first process gas (source gas) including organic metal of a group III element and the main carrier gas to the reaction chamber. The first process gas is gas including a group III element which is used to form a group III -V semiconductor film on a wafer. The main carrier gas is, for example, hydrogen gas.

The group III element is, for example, gallium (Ga), aluminum (Al), or indium (In). In addition, the organic metal is, for example, trimethylgallium (TMG) trimethylalurninum (TMA), or trimethylindium (TMI).

The vapor phase growth apparatus further includes a storage container 12 that stores organic metal 11. The storage container 12 stores, for example, liquid TMG which is a gallium source.

The number of storage containers 12 is not limited to one and two or more storage containers 12 may be provided. The organic metal 11 stored in the storage container 12 is not limited to TMG and may be TMA, TMI, $Cp_2Mg$ (bis (cyclopentadienyl)magnesium), and other organic metal materials. The organic metal 11 may be a liquid or a solid.

Figure 2A:
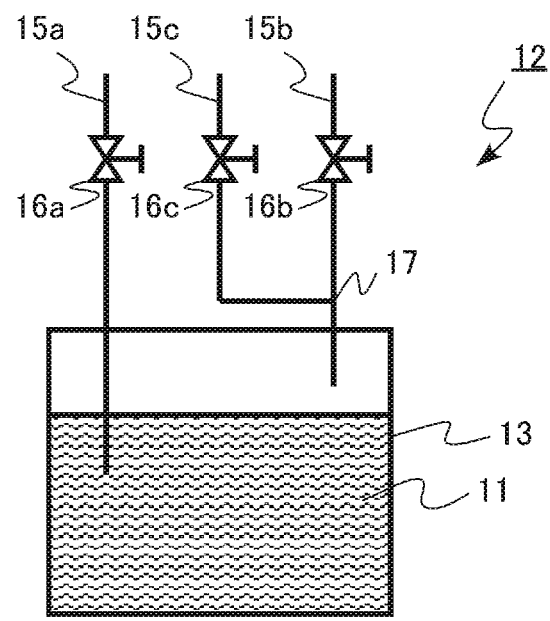
FIGS. 2A and 2B are diagrams illustrating the structure of a storage container according to the embodiment.
Figure 2B:
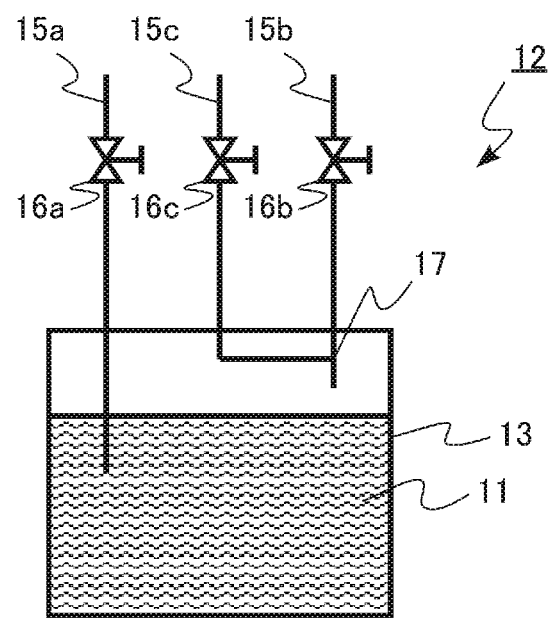

FIGS. 2A and 2B are diagrams illustrating the structure of the storage container according to this embodiment. The storage container 12 includes a container portion 13, a first pipe 15a, a second pipe 15b, and a third pipe 15c.

The container portion 13 can store liquid or solid organic metal 11. The container portion 13 is made of, for example, metal.

The first pipe 15a connects the inside and outside of the container portion 13. The first pipe 15a has a first valve 16a which is provided outside the container portion 13. The first valve 16a is, for example, a manual valve. When the organic metal is a liquid, the end of the first pipe 15a is provided in a liquid phase, as shown in FIGS. 2A and 2B. When the organic metal is a solid, the end of the first pipe 15a is provided in a vapor phase.

The second pipe 15b connects the inside and outside of the container portion 13. The second pipe 15b has a second valve 16b which is provided outside the container portion 13. The second valve 16b is, for example, a manual valve.

The third pipe 15c is connected to the second pipe 15b in a connection portion 17. The third pipe 15c has a third valve 16c which is provided outside the container portion 13. The third valve 16c is, for example, a manual valve. The connection portion 17 is provided in the second valve 16b so as to be close to the container portion 13.

The third pipe 15c may be connected to the second pipe 15b outside the container portion 13 as shown in FIG. 2A or may be connected to the second pipe 15b inside the container portion 13 as shown in FIG. 2B. It is preferably P that the third pipe 15c be connected to the second pipe 15b outside the container portion 13, as shown in FIG. 2A, in order to easily manufacture or maintain the storage container 12.

The vapor phase growth apparatus includes a thermostatic bath 50 that stores a liquid 52 and maintains the temperature of the liquid 52 at a constant level. The liquid 52 is, for example, pure water or a fluorine-based fluid.

The container portion 13 of the storage container 12 is immersed and held in the liquid 52 of the thermostatic bath 50. The liquid 52 in the thermostatic bath 50 is maintained at a temperature higher than a room temperature. Here, the room temperature means the temperature of air surrounding the thermostatic bath 50.

It is preferable that the temperature of the liquid 52 in the thermostatic bath 50 be equal to or higher than 30° C. in order to increase the vapor pressure of the organic metal 11. In addition, it is preferable that the temperature of the liquid 52 be set to a temperature lower than the boiling point of the organic metal 11 in order to maintain the organic metal 11 in a liquid state or a solid state. It is preferable that the temperature of the liquid 52 be equal to or lower than 60° C. in order to control the temperature of the thermostatic bath 50.

The vapor phase growth apparatus further includes a carrier gas supply path 18 which is connected to the storage container 12 and supplies the carrier gas to the storage container 12. The carrier gas supply path 18 has a mass flow controller M2 which controls the flow rate of the carrier gas. The carrier gas is, for example, hydrogen gas.

The carrier gas supply path 18 is connected to the first pipe 15a at a connection portion 54a. A valve 56a is provided between the connection portion 54a and the mass flow controller M2. The valve 56a is, for example, an air operation valve.

A vacuum suction path 61 is connected between the valve 56a and the first valve 16a through a connection portion 57. The connection portion 57 is, for example, a three-way valve. Vacuum suction and purging can be performed between the valve 56a and the first valve 16a by the vacuum suction path 61.

The carrier gas is used to bubble or sublimate the organic metal 11 in the storage container 12. An organic-metal-containing gas including the organic metal 11 is generated by bubbling or sublimation with the carrier gas.

The vapor phase growth apparatus further includes an organic-metal-containing gas transportation path 20 that is connected to the storage container 12. The organic-metal-containing gas transportation path 20 is connected to the reaction chamber 10 through the first gas supply path 31. The organic-metal-containing gas transportation path 20 supplies the organic-metal-containing gas including the organic metal 11 which is generated by the bubbling or sublimation with the carrier gas to the reaction chamber 10.

The organic-metal-containing gas transportation path 20 is connected to the second pipe 15b at a connection portion 54b. A valve 56b is provided between the connection portion 54b and the reaction chamber 10. The valve 56b is, for example, an air operation valve.

A vacuum suction path 62 is connected between the valve 56b and the second valve 16b through a connection portion 59. The connection portion 59 is, for example, a three-way valve. Vacuum suction and purging can be performed between the valve 56b and the second valve 16b by the vacuum suction path 62.

The carrier gas supply path 18 is connected to the organic-metal-containing gas transportation path 20 in a connection portion 58. The connection portion 58 is, for example, a three-way valve. When the organic-metal-containing gas does not flow to the reaction chamber 10, for example, in an idling state, the valves 56a and 56b are closed and the carrier gas can flow to the reaction chamber 10 through the connection portion 58 and the organic-metal-containing gas transportation path 20.

The vapor phase growth apparatus further includes a diluent gas transportation path 26 that is connected to the organic-metal-containing gas transportation path 20 and transports a diluent gas. The diluent gas transportation path 26 has a mass flow controller M3 that controls the flow rate of the diluent gas. The diluent gas is, for example, hydrogen gas.

The diluent gas transportation path 26 is connected to the third pipe 15c at a connection portion 54c. A valve 56c is provided between the connection portion 54c and the mass flow controller M3. The valve 56c is, for example, an air operation valve.

A vacuum suction path 63 is connected between the valve 56c and the third valve 16c through a connection portion 60. The connection portion 60 is, for example, a three-way valve. Vacuum suction and purging can be performed between the valve 56c and the third valve 16c by the vacuum suction path 63.

The diluent gas transportation path 26 is connected to the organic-metal-containing gas transportation path 20 at a position below a liquid level 53 of the liquid 52 in the thermostatic bath 50. In other words, a connection portion 17 between the diluent gas transportation path 26 and the organic-metal-containing gas transportation path 20 is below the liquid level 53. The diluent gas transportation path 26 and the organic-metal-containing gas transportation path 20 are connected to each other through the third pipe 15c and the second pipe 15b.

The connection portion 17 is located in the liquid 52 when the storage container 12 has the shape shown in FIG. 2A. In addition, the connection portion 17 is located in the container portion 13 of the storage container 12 when the storage container 12 has the shape shown in FIG. 2B.

The diluent gas dilutes the organic-metal-containing gas including the organic metal 11 which is generated by the bubbling or sublimation with the carrier gas. The organic-metal-containing gas is diluted below the liquid level 53 of the thermostatic bath 50, that is, in a state in which it has the same temperature as the liquid 52 in the thermostatic bath 50.

The organic-metal-containing gas transportation path 20 is connected to the first gas supply path 31 in a connection portion 28. The connection portion 28 is, for example, a four-way valve and controls the flow and cutoff of the organic metal 11 to the first gas supply path 31. When the four-way valve is opened, the organic metal 11 is supplied to the first gas supply path 31. When the four-way valve is closed, the organic metal 11 is not supplied to the first gas supply path 31.

The vapor phase growth apparatus according to this embodiment further includes a gas discharge path 40. The gas discharge path 40 is provided in order to discharge gas including the organic metal 11 to the outside of the apparatus, without passing through the reaction chamber 10, when the vapor phase growth apparatus is in a state other than a film formation state.

The gas discharge path 40 is branched from the first gas supply path 31. The main carrier gas is supplied to the gas discharge path 40.

The gas discharge path 40 is connected to the organic-metal-containing gas transportation path 20 in a connection portion 30 which is outside the thermostatic bath 50. The connection portion 30 is, for example, a three-way valve and controls the flow and cutoff of the organic metal 11 to the gas discharge path 40. When the three-way valve is opened, the organic metal 11 is supplied to the gas discharge path 40.

When the three-way valve is dosed, the organic metal 11 is not supplied to the gas discharge path 40. The gas discharge path 40 is connected to a path 42 through which gas is discharged from the reaction chamber 10.

A first adjustment portion 44 is provided in the first gas supply path 31 so as to be closer to the reaction chamber 10 than the connection portion 28. In other words, the first adjustment portion 44 is provided closer to the reaction chamber 10 than a connection portion between the first gas supply path 31 and the organic-metal-containing gas transportation path 20.

A second adjustment portion 46 is provided closer to the outside of the apparatus than the connection portion 30 of the gas discharge path 40. In other words, the second adjustment portion 46 is provided closer to the outside of the apparatus than the connection portion 30 between the gas discharge path 40 and the organic-metal-containing gas transportation path 20.

The first adjustment portion 44 is a back pressure regulator and the second adjustment portion 46 is a mass flow controller. The back pressure regulator has a function of maintaining the pressure of the primary side, that is, the upstream side of the back pressure regulator at a constant value.

The second gas supply path 32 supplies a second process gas including ammonia ($NH_3$) to the reaction chamber. The second process gas is a source gas of nitrogen (N), which is a group V element, when a group III-V semiconductor film is formed on the wafer. The second process gas is supplied to the second gas supply path 32. The second gas supply path 32 has a mass flow controller (not illustrated) that controls the flow rate of the second process gas supplied to the second gas supply path 32.

In addition, the third gas supply path 33 that supplies a third process gas to the reaction chamber 10 is provided. The third process gas is a so-called separation gas and is ejected between the first process gas and the second process gas when the first process gas and the second process gas are ejected into the reaction chamber 10. The third process gas prevents the reaction between the first process gas and the second process gas immediately after the first process gas and the second process gas are ejected.

The third gas supply path 33 is provided with a mass flow controller (not illustrated) that controls the flow rate of the separation gas supplied to the third gas supply path 33. The separation as is, for example, hydrogen gas.

Figure 3:
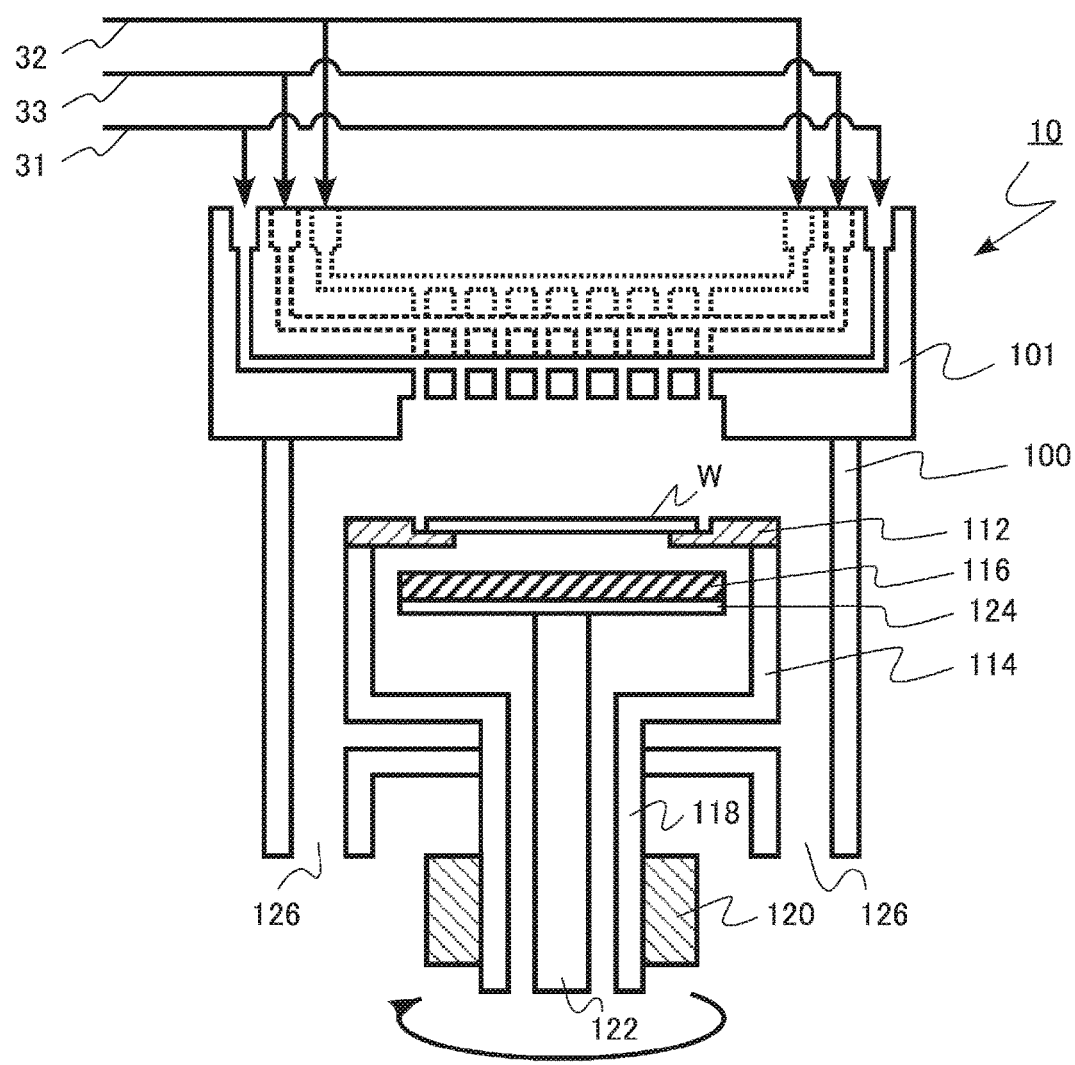
FIG. 3 is a cross-sectional view schematica illustrating a main portion of the vapor phase growth apparatus according to the embodiment.

FIG. 3 is a cross-sectional view schematically illustrating a main portion of the vapor phase growth apparatus according to this embodiment. As shown in FIGS. 2A and 2B, the reaction chamber 10 according to this embodiment has, for example, a wall surface 100 of a cylindrical hollow body made of stainless steel. The reaction chamber 10 includes a shower plate 101 that is provided in an upper part of the reaction chamber 10 and supplies the process gas into the reaction chamber 10.

The reaction chamber 10 includes a support portion 112 which is provided below the shower plate 101 in the reaction chamber 10 and on which a semiconductor wafer (substrate) W can be placed. The support portion 112 is, for example, an annular holder that has an opening formed at the center thereof or a susceptor that comes into contact with substantially the entire rear surface of a semiconductor wafer W.

The three gas supply paths, that is, the first gas supply path 31, the second gas supply path 32, and the third gas supply path 33 are connected to the shower plate 101. A plurality of gas election holes for ejecting the first, second, and third process gases which are respectively supplied from the first gas supply path 31, the second gas supply path 32, and the third as supply path 33 into the reaction chamber 10 are provided in a surface of the shower plate 101 close to the reaction chamber 10.

A rotating unit 114 which rotates, with the support portion 121 arranged on the upper surface thereof, and a heater which serves as a heating unit 116 for heating the wafer W placed on the support portion 112 are provided below the support portion 112. In the rotating unit 114, a rotating shaft 118 is connected to a rotating mechanism 120 that is provided on the lower side. The rotating mechanism 120 can rotate the semiconductor wafer W about the center of the semiconductor wafer W at a speed that is, for example, equal to or greater than 50 rpm and equal to or less than 3000 rpm.

It is preferable that the diameter of the cylindrical rotating unit 114 be substantially equal to the outside diameter of the support portion 112. The rotating shaft 118 is provided at the bottom of the reaction chamber 10 so as be rotated through a vacuum seal member.

The heating unit 116 is provided so as to be fixed to a support stand 124 fixed to a support shaft 122 which passes through the rotating shaft 118. Power is supplied to the heating unit 116 by a current introduction terminal and an electrode (not illustrated) The support stand 124 is provided with, for example, a push up pin (not illustrated) that is used to attach or detach the semiconductor wafer W to or from the support portion 112.

A gas discharge portion 126 that discharges a reaction product obtained by the reaction of a source gas on the surface of the semiconductor wafer W and a residual process gas in the reaction chamber 10 to the outside of the reaction chamber 10 is provided at the bottom of the reaction chamber 10. The gas discharge portion 126 is connected to the gas discharge path 40 (FIG. 1) through the gas discharge path 42.

In the reaction chamber 10 illustrated in FIG. 3, a wafer inlet and a gate valve (not illustrated) through which the semiconductor wafer W passes are provided in the side wall of the reaction chamber 10. Therefore, the semiconductor wafer W can be transferred by a handling arm between a load lock chamber (not illustrated) and the reaction chamber 10 which are connected by the gate valve. For example, the handling arm in which a hand portion which is provided at the leading end and on which the wafer is placed is made of synthetic quart can be inserted into a space between the shower plate 101 and the support portion 112.

A vapor phase growth method according to this embodiment uses the epitaxial growth apparatus illustrated in FIG. 1. Next, an example in which undoped GaN is epitaxially grown by the vapor phase growth method accord in to this embodiment will be described.

First, as a preparatory stage, the storage container 12 storing liquid TMG is loaded to the vapor phase growth apparatus. The container portion 13 of the storage container 12 is immersed in the liquid 52 of the thermostatic bath 50.

The first pipe 15a, the second pipe 15b, and the third pipe 15c of the storage container 12 are connected to the carrier gas supply path 18, the organic-metal-containing gas transportation path 20, and the diluent gas transportation path 26 at the connection portion 54a, the connection portion 54b, and the connection portion 54c, respectively. After the first pipe 15a, the second pipe 15b, and the third pipe 15c are connected, vacuum suction and purging are performed between the valve 56a and the first valve 16a, between the valve 56b and the second valve 16b, and between the valve 56c and the third valve 16c by the vacuum suction paths 61, 62, and 63, respectively. Then, the first valve 16a, the second valve 16b, and the third valve 16c are opened.

Then, the semiconductor wafer W which is an example of the substrate is loaded to the reaction chamber 10.

For example, when an undoped GaN film is formed on the semiconductor wafer W, TMG having hydrogen gas as the main carrier gas is supplied from the gas supply path 31. In addition, for example, ammonia is supplied from the second gas supply path 32. For example, hydrogen gas is supplied as the separation gas from the third gas supply path 33.

TMG which is an example of the organic metal is stored in the storage container 12. Then, the internal temperature of the thermostatic bath 50 having the storage container 12 accommodated therein is set to room temperature, that is, a temperature higher than the outside temperature of the thermostatic bath 50. For example, when the room temperature is 25° C., the internal temperature of the thermostatic bath 50 is set to be equal to or higher than 30° C. and less than the boiling point of the TMG. The temperature of the liquid 52 is also maintained in this temperature range.

For example, hydrogen gas is supplied as the carrier gas from the carrier gas supply path 18 to the liquid TMG stored in the storage container 12 to perform bubbling. An organic-metal-containing gas including gallium is generated by the bubbling.

Since the thermostatic bath 50 is set to a predetermined temperature that is equal to or higher than 30° C. and is less than the boiling point of TMG, the temperature of TMG is also maintained at the predetermined temperature. Therefore, TMG is bubbled in a temperature environment of the predetermined temperature.

Then, the gas (organic-metal-containing gas) including gallium which is generated by bubbling is maintained in the temperature environment of the predetermined temperature until it is diluted with the diluent gas and is diluted with the diluent gas at the predetermined temperature.

In this embodiment, the gas including gallium is diluted with hydrogen gas, which is an example of the diluent as supplied from the diluent gas transportation path 26, at a position below the liquid level 53 of the liquid 52 in the thermostatic bath 50. Since the thermostatic bath 50, that is, the liquid 52 is set to a predetermined temperature that is equal to or higher than 30° C. and is less than the boiling point of TMG, the gas including gallium is maintained in the temperature environment of the predetermined temperature and is diluted at the predetermined temperature.

Then, the main carrier gas and the organic-metal-containing gas including gallium which has been diluted with the hydrogen gas are mixed with each other in a temperature environment lower than the predetermined temperature to generate a source gas. Here, hydrogen gas which is an example of the main carrier gas supplied to the first gas supply path 31, and the gas including the galliumum are mixed with each other outside the thermostatic bath 50.

The internal temperature of the thermostatic bath 50 is set such that the outside temperature of the thermostatic bath 50 is lower than the internal temperature of the thermostatic bath 50. Therefore, the gas including gallium and the hydrogen gas which is the main carrier gas are mixed with each other in a temperature environment lower than the predetermined temperature to generate a source gas. A source gas including TMG which has, as the main carrier gas, hydrogen gas supplied from the first gas supply path 31 to the reaction chamber 10 is generated by the above-mentioned method.

It is preferable that the following relational expression be satisfied during vapor phase growth:

$$Tb > Ta \quad \text{(Expression 1)};$$

$$P\_MO = f\_MO/(f\_MO + f\_\text{carrier} + f\_\text{add}) \times P\_\text{source} < P\_\text{sat}\_MO(Ta) \quad \text{(Expression 2); and}$$

$$f\_MO = P\_\text{sat}\_MO(Tb)/(P\_\text{source} - P\_\text{sat}\_MO(Tb)) \times f\_\text{carrier} \quad \text{(Expression 3)}.$$

In the above-mentioned expressions, Ta is room temperature and Tb is the temperature of the liquid in the thermostatic bath. In addition, P_MO is the vapor pressure of a group III gas, f_MO is the flow rate of the group III gas, and f_carrier is the flow rate of the carrier gas (a bubbling gas or a sublimation gas). Further, f_add is the flow rate of the diluent gas (additional gas) and P_source is the pressure of the source gas. Furthermore, P_sat_MO(Ta) is the saturated vapor pressure of the group III gas at the room temperature and P_sat_MO(Tb) is the saturated vapor pressure or the group III gas at the temperature of the liquid in the thermostatic bath.

Expression 1 indicates that the temperature of the thermostatic bath is higher than the room temperature. In this embodiment, a necessary condition for increasing the concentration of a group III gas is that the temperature of the thermostatic bath is higher than the room temperature.

Expression 2 indicates the following relationship: the vapor pressure of the group III gas in the line of the organic-metal-containing gas transportation path 20=the flow rate of the group III gas/(the flow rate of the group III gas in the organic-metal-containing gas transportation path 20+the flow rate of the carrier gas in the carrier gas supply path 18+the flow rate of the diluent gas in the diluent gas transportation path 26)×the pressure of the source gas in the first adjustment portion 44<the vapor pressure of the group III gas at the room temperature. That is, Expression 2 indicates that the vapor pressure of the group III gas emitted from a group III gas container (thermostatic bath 50) is lower than saturated vapor pressure at the room temperature. Expression 2 indicates the necessary condition that the group III gas is nor liquefied at the room temperature.

Expression 3 indicates the following relationship: the flow rate of the group III gas in the organic-metal-containing gas transportation path 20=the saturated vapor pressure of the group III gas at the temperature of the thermostatic bath 50/(the pressure of the source gas in the first adjustment portion 44−the saturated vapor pressure of the group III gas at the temperature of the thermostatic bath 50)×the flow rate of the carrier gas in the carrier gas supply path 18. That is, Expression 3 indicates a method for calculating the flow rate of the group III gas in the organic-metal-containing gas transportation path 20 in Expression 2.

Next, a detailed process in the reaction chamber 10 which is an example of the reaction chamber will be described.

For example, hydrogen gas is supplied from three gas supply paths 31, 32, and 33 to the reaction chamber 10 and a vacuum pump (not illustrated) is operated to discharge as in the reaction chamber 10 from the as discharge portion 126. With the reaction chamber 10 controlled to be at predetermined pressure, the semiconductor wafer W is placed on the support portion. 112 in the reaction chamber 10.

When the semiconductor wafer W is loaded, for example, the gate valve (not illustrated) of the wafer inlet of the reaction chamber 10 is opened and the semiconductor wafer W in the load lock chamber is loaded to the reaction chamber 10 which is heated at a predetermined temperature by the handling arm.

Then, the semiconductor wafer W is placed on the support portion 112 through, for example, the push up pin (not illustrated). The handling arm is returned to the load lock chamber and the gate valve is closed.

Here, the semiconductor wafer W placed on the support portion 112 heated to a predetermined temperature, for example, an epitaxial growth temperature of about 1100° C. by the heating unit 116.

Then, TMG (the first process gas: the source gas) having hydrogen gas as the main carrier gas is supplied from the first gas supply path 31 to the reaction chamber 10 through the shower plate 101. In addition, ammonia (second process gas) is supplied from the second gas supply path 32 to the reaction chamber 10 through the shower plate 101. Furthermore, hydrogen gas (third process gas) is supplied as the separation gas from the third gas supply path 33 to the reaction chamber 10 through the shower plate 101 in this way, a CaN film is epitaxially grown on the surface of the semiconductor wafer W.

When the epitaxial growth is completed, the flow of the group III source gas to the first gas supply path 31 is stopped. In this way, the growth of a GaN single-crystal film is completed. Then, the heating power of the heating unit 116 is decreased to reduce the temperature of the semiconductor wafer W. After the temperature of the semiconductor wafer W is reduced to a predetermined temperature, the supply of ammonia from the second gas supply path 32 to the reaction chamber 10 is stopped.

When the formation of the film is completed, hydrogen gas supplied to the reaction chamber 10 through the first gas supply path 31. In addition, hydrogen gas is supplied to the reaction chamber 10 through the second gas supply path 32.

Here, for example, the rotation of the rotating unit 114 is stopped and the heating power of the heating unit 116 is adjusted to reduce the transfer temperature, with the semiconductor wafer W having the single-crystal film formed thereon being placed on the support portion 112.

Then, for example, the semiconductor wafer W is detached from the support portion 112 by the push up pin. Then, the gate valve is opened again and the handling arm is inserted between the shower plate 101 and the support portion 112. Then, the semiconductor wafer W is placed on the handling arm. Then, the handling arm having the semiconductor wafer W placed thereon returns to the load lock chamber.

In this way, one film formation process for the semiconductor wafer W is completed. For example, films may be formed on another semiconductor wafer W by the same process sequence as described above.

The vapor phase growth apparatus according to this embodiment sets the temperature of the liquid 52 in the thermostatic bath 50 to be higher than an environment temperature outside the thermostatic bath 50. When the internal temperature of the thermostatic bath 50 is set to a high temperature, the saturated vapor pressure of organic metal in gas increases and it is possible to increase the concentration of organic metal in gas even at the same flow rate of the carrier gas. Therefore, it is possible to stably supply a large amount of organic-metal-containing gas with a simple structure.

Since the saturated vapor pressure of organic metal is high, it is possible to reduce the supply flow rate of the carrier gas for evaporating the same amount of organic metal in gas. Therefore, it is possible to reduce the running costs of the apparatus. In addition, it is possible to prevent the flow rate of gas or the concentration of organic metal in gas from being unstable due to pressure loss in the pipe.

The vapor phase growth apparatus according to this embodiment mixes the organic-metal-containing gas and the diluent gas in a temperature environment equal to the temperature of the liquid 52 in the thermostatic bath 50. Therefore, it is possible to maintain the gas including organic metal at the same temperature as that during the bubbling or sublimation of the organic metal 11 until the gas including organic metal is diluted with the diluent gas. Therefore, the temperature of the gas including organic metal is not reduced until the gas including organic metal is diluted with the diluent gas and the saturated vapor pressure of the organic metal is not reduced. As a result, the condensation of the organic metal is prevented.

In particular, the connection portion 17 between the organic-metal-containing gas and the diluent gas is provided in an environment which is surrounded by a liquid with a higher thermal capacity than air. Therefore, the temperature of the connection portion 17 is stabilized and it is possible to mix the organic-metal-containing gas and the diluent gas, without cooling the organic-metal-containing gas and the diluent gas. For example, it is possible to mix the organic-metal-containing gas and the diluent gas in a stable temperature environment, as compared to a case in which the connection portion 17 is provided in air. As a result, it is possible to effectively prevent the condensation of organic metal.

In the vapor phase growth apparatus according to this embodiment, the gas including organic metal is further diluted with the main carrier gas outside the thermostatic bath 50 where the temperature is lower than the internal temperature of the thermostatic bath 50. Since the organic metal has already been diluted in a high-temperature environment, the condensation of organic metal is less likely to occur even when the gas including organic metal is transported to the outside of the thermostatic bath 50 where the temperature is low.

In this embodiment, the storage container 12 can be incorporated into a gas supply system of the existing vapor phase growth apparatus, without a large change in the structure. Therefore, according to the storage container 12 of this embodiment, it is possible to prevent the condensation of organic metal with a simple structure and to stably supply the organic-metal-containing gas.

According to the vapor phase growth method of this embodiment, it is possible to increase the concentration of the organic-metal-containing gas and to stabilize the concentration. Therefore, it is possible to stably supply a large amount of organic-metal-containing gas. In addition, it is possible to reduce the supply flow rate of the carrier gas and thus to reduce the running costs of the apparatus.

The embodiments of the invention have been described above with reference to the detailed examples. The above-described embodiments are illustrative examples and do not limit the invention. The components according to each embodiment may be appropriately combined with each other.

For example, in the above-described embodiment, the undoped gallium nitride (GaN) single-crystal film is formed. However, for example, the invention can be applied to form other group III-V nitride-based semiconductor single-crystal films, such as p-type GaN, n-type GaN, aluminum nitride (AlN), aluminum gallium nitride (AlGaN), and indium gallium nitride (InGaN) single-crystal films. In addition, the invention can be applied to a group III-V semiconductor such as GaAs.

In the above-described embodiments, hydrogen gas ($H_2$) is used as the main carrier gas, the carrier gas, the diluent gas, and the separation gas. However, nitrogen as ($N_2$), argon gas (Ar), helium gas (He), or a combination of the gases can be applied.

In the above-described embodiments, the organic-metal-containing gas is diluted with the diluent gas and is mixed with the main carrier gas. However, the mixture of the main carrier gas may be omitted.

In the above-described embodiments, liquid organic metal is bubbled to generate the organic-metal-containing gas. However, the invention can be applied to a case in which solid organic metal is sublimated to generate the organic-metal-containing gas.

In the above-described embodiments, the vertical single-wafer-type epitaxial apparatus which forms films on one wafer is given as an example. However, the vapor phase growth apparatus is not limited to the single-wafer-type epitaxial apparatus. For example, the invention can be applied to a o horizontal epitaxial apparatus or a planetary CVD apparatus that simultaneously forms films on a plurality of wafers which revolve on their own axes and around the apparatus.

In the above-described embodiments, portions which are not necessary to describe the invention, such as the structure of the apparatus or a manufacturing method, are not described. However, the necessary structure of the apparatus or a necessary manufacturing method can be appropriately selected and used. In addition, all of the vapor phase growth apparatuses, the storage containers, and the vapor phase growth methods which include the components according to the invention and whose design can be appropriately changed by those skilled in the art are included in the scope of the invention. The scope of the invention is defined by the scope of the claims and equivalents thereof.

What is claimed is:

1. A vapor phase growth apparatus comprising:
a reaction chamber;
a storage container storing organic metal and including:
   a container portion capable of storing the organic metal,
   a first pipe connecting an inside and an outside of the container portion and having a first valve provided outside the container portion,
   a second pipe connecting the inside and the outside of the container portion and having a second valve provided outside the container portion, and
   a third pipe having a third valve provided outside the container portion and connected to the second pipe inside the container portion, the third pipe being not connected to the first pipe;
a thermostatic bath storing a liquid with a temperature higher than a room temperature and equal to or lower than 60° C. and holding the storage container immersed in the liquid, the third pipe connected to the second pipe at a position below a liquid level of the liquid in the thermostatic bath;
a carrier gas supply path connected to the first pipe and supplying a carrier gas to the storage container;
an organic-metal-containing gas transportation path connected to the second pipe and the reaction chamber, the organic-metal-containing gas transportation path transporting an organic-metal-containing gas to the reaction chamber, the organic-metal-containing gas including the organic metal generated by bubbling or sublimation with the carrier gas; and
a diluent gas transportation path connected to the third pipe and transporting a diluent gas for diluting the organic-metal-containing gas.

2. The vapor phase growth apparatus according to claim 1,
wherein the liquid is pure water or a fluorine-based fluid.

3. The vapor phase growth apparatus according to claim 1,
wherein the organic metal is trimethylgallium (TMG), trimethylaluminum (TMA), trimethylindium (TMI), or bis(cyclopentadienyl)magnesium ($Cp_2Mg$).

4. The vapor phase growth apparatus according to claim 1,
wherein the temperature of the liquid is equal to or higher than 30° C.

5. The vapor phase growth apparatus according to claim 1,
wherein the carrier gas is a hydrogen gas.

6. A storage container comprising:
a container portion capable of storing organic metal for vapor phase growth;
a first pipe connecting the inside and outside of the container portion and having a first valve provided outside the container portion;
a second pipe connecting the inside and the outside of the container portion and having a second valve provided outside the container portion; and
a third pipe having a third valve provided outside the container portion and connected to the second pipe inside the container portion, the third pipe being not connected to the first pipe.

7. The storage container according to claim 6,
wherein the first valve, the second valve, and the third valve are manual valves.

8. The storage container according to claim 6,
wherein the organic metal is trimethylgallium (TMG), trimethylaluminum (TMA), trimethylindium (TMI), or bis(cyclopentadienyl)magnesium ($Cp_2Mg$).

9. A vapor phase growth method by using the vapor phase growth apparatus of claim 1, the method comprising:
loading a substrate into a reaction chamber of the vapor phase growth apparatus;
bubbling or sublimating organic metal stored in the storage container of the vapor phase growth apparatus with a carrier gas to generate an organic-metal-containing gas, the storage container being immersed in a liquid with a predetermined temperature higher than a room temperature and equal to or lower than 60° C., the liquid being stored in the thermostatic bath of the vapor phase growth apparatus;
diluting the organic-metal-containing gas with a diluent gas at a position below a liquid level of the liquid by the diluent gas transportation path of the vapor phase growth apparatus; and
supplying the diluted organic-metal-containing gas by the organic-metal-containing gas transportation path of the vapor phase growth apparatus to the reaction chamber to form a semiconductor film on a surface of the substrate.

10. The vapor phase growth method according to claim 9, wherein the liquid is pure water or a fluorine-based fluid.

11. The vapor phase growth method according to claim 9, wherein the organic metal is trimethylgallium (TMG), trimethylaluminum (TMA), trimethylindium (TMI), or bis(cyclopentadienyl)magnesium ($Cp_2Mg$).

12. The vapor phase growth method according to claim 9, wherein the temperature of the liquid is equal to or higher than 30° C.

13. The vapor phase growth method according to claim 9, wherein the carrier gas is a hydrogen gas.

* * * * *